(12) United States Patent (10) Patent No.: US 7,398,177 B2
Smeets et al. (45) Date of Patent: Jul. 8, 2008

(54) MEASUREMENT SUBSTRATE, SUBSTRATE TABLE, LITHOGRAPHIC APPARATUS, METHOD OF CALCULATING AN ANGLE OF AN ALIGNMENT BEAM OF AN ALIGNMENT SYSTEM, AND ALIGNMENT VERIFICATION METHOD

(75) Inventors: Erik Marie Jose Smeets, Prinsenbeek (NL); Fransiscus Godefridus Casper Bijnen, Valkenswaard (NL); Geoffrey Norman Phillipps, Luyksgestel (NL)

(73) Assignee: ASML Netherlands B.V., Veldhoven (NL)

( * ) Notice: Subject to any disclaimer, the term of this patent is extended or adjusted under 35 U.S.C. 154(b) by 129 days.

(21) Appl. No.: 10/964,814

(22) Filed: Oct. 15, 2004

(65) Prior Publication Data

US 2006/0085161 A1 Apr. 20, 2006

(51) Int. Cl.
*G01C 9/00* (2006.01)
(52) U.S. Cl. ..................................... 702/151
(58) Field of Classification Search ................... 702/151
See application file for complete search history.

(56) References Cited

U.S. PATENT DOCUMENTS 4,650,983 A * 3/1987 Suwa ........................ 250/204
5,300,786 A * 4/1994 Brunner et al. ............. 250/548
6,136,481 A * 10/2000 Aoki ............................ 430/7

\* cited by examiner

*Primary Examiner*—John E Barlow, Jr.
*Assistant Examiner*—Stephen J Cherry
(74) *Attorney, Agent, or Firm*—Pillsbury Winthrop Shaw Pittman, LLP

(57) ABSTRACT

A method of calculating an angle of an alignment beam of an alignment system in, for example, a lithographic projection apparatus includes measuring the position of at least two alignment marks. These two alignment marks are manufactured on a measurement substrate or they can be arranged on a reference on a substrate table of the lithographic apparatus itself. The second mark is covered by a transparent plate. Then, the position of the two marks is measured using the alignment system. Due to refraction of the alignment beam in the transparent plate, the alignment beam is shifted when returning to the alignment system. The shift of the alignment beam results in a deviated measured position of the second mark. This shift can be calculated because the distance between the two marks is known. The shift is used to calculate the angle of the alignment beam. The angle can be used to improve a FTBA error verification method.

9 Claims, 5 Drawing Sheets

MEASUREMENT SUBSTRATE, SUBSTRATE TABLE, LITHOGRAPHIC APPARATUS, METHOD OF CALCULATING AN ANGLE OF AN ALIGNMENT BEAM OF AN ALIGNMENT SYSTEM, AND ALIGNMENT VERIFICATION METHOD

BACKGROUND OF THE INVENTION

1. Field of the Invention

The present invention relates to a measurement substrate, a substrate table, a lithographic apparatus, a method of calculating an angle of an alignment beam of an alignment system, and an alignment verification system.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Before the exposure of the substrate, it must be correctly aligned to ensure that the functional features are imaged onto the correct position of the substrate. Alignment is the process of positioning the image of a specific point on the mask to a specific point on the substrate which is to be exposed. Typically one or more alignment marks, such as a small pattern, are provided on each of the substrate and the mask. A device may include many layers which are built up by successive exposures with intermediate processing steps. Before each exposure, alignment between the marks on the substrate and the mask is performed to minimize any positional error between the new exposure and the previous ones, which error is termed overlay error.

The marks are commonly on the front side of the substrate, but can also be on the backside of the substrate. Marks on the backside of the substrate are used, for example, when exposure is to take place on the opposite side of the substrate. This occurs particularly in the manufacture of micro electro mechanical systems (MEMS), micro opto-electro mechanical systems (MOEMS), or in Micro Systems Technology (MST).

Figure 1:
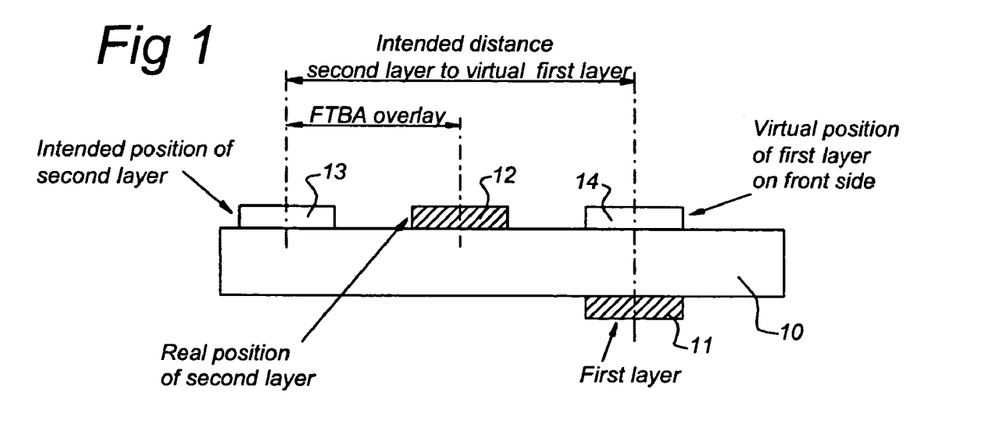
FIG. 1 depicts how an FTBA overlay error is defined.

In front-to-backside alignment (FTBA) applications, both sides of a substrate are used for exposure. In such a case, overlay can be defined with which portion or portions on a back side can be positioned with respect to a front side. This is explained in more detail with reference to FIG. 1. FIG. 1 shows a substrate 10 on which a first layer 11 is processed on a first side of the substrate 10. A second layer 12 is processed on a second side of the substrate 10. After having exposed the first layer 11 on the substrate 10 and turning the substrate upside down, the second layer is intended to be exposed on position 13. However, the real, or actual, position it is exposed on is position 12. The difference between the intended position 13 and the actual position 12 is called overlay. As the intended position 13 has an intended relative distance with respect to a virtual position of the first layer 11 (see virtual layer 14), the overlay depends on the position of the virtual layer 14 and thus layer 11 itself. As layer 11 is on the back side of the substrate, and layer 12 on the front side, the overlay described above is referred to as Front-To-Back-Aligned overlay, or FTBA overlay. FTBA overlay is also referred to as FTBA overlay error.

To actually verify a specified FTBA overlay error in a particular lithographic apparatus, a FTBA overlay error measurement method is required. In commonly assigned, co-pending U.S. Patent Application Publication 2006/0023214 A1, incorporated herein by reference, front to backside alignment (FTBA) verification is performed using a glass verification substrate. The verification substrate includes alignment marks on one side of the verification substrate only, for aligning the verification substrate. Alignment of the verification substrate for exposure of the FTBA overlay patterns is performed by processing both layers, each at an other side of the substrate. The overlay patterns for the verification include a set of verification marks. For the required alignments the same set of alignment marks on the same physical side of the substrate is used. The order, first backside or first front side alignment, may be varied. Thus, one layer is exposed by front side alignment and one layer by back side alignment. The verification substrate is transparent for radiation used by the laser of an alignment system. This means that the back side verification marks which are required to determine the FTBA overlay value can be measured by the alignment system from the front side. However, the non-perpendicularity of the alignment beam (i.e. the laser beam) introduces a shift in the determination of the FTBA overlay.

SUMMARY OF THE INVENTION

It is therefore desirable to determine the beam angle of the alignment beam in an alignment system, in order to determine a lateral distance between marks which are located on different sides of a substrate. A value of the beam angle can be used to correct for the influence of the non-perpendicularity of the alignment beam. These corrections can be used when calculating the FTBA overlay error. However, it is evident that determining a beam angle relative to a surface on which the beam impinges may be of interest in other situations too. Therefore, it is a general aspect of the present invention to determine beam angles.

According to a first aspect of the present invention, there is provided a measurement substrate on which a covered alignment mark and an uncovered alignment mark are provided, and a transparent plate covering the covered alignment mark.

According to another aspect of the present invention, there is provided a substrate table configured to hold a measurement substrate on which a covered alignment mark and an uncovered alignment mark are provided, and a transparent plate covering the covered alignment mark According to another aspect of the present invention there is provided a lithographic apparatus comprising substrate table configured to hold a measurement substrate on which a covered alignment mark and an uncovered alignment mark are provided, and a transparent plate covering the covered alignment mark.

According to yet another aspect of the present invention, there is provided a method of calculating an angle of an alignment beam of an alignment system with respect to a predetermined line, including arranging a plurality of alignment marks on a measurement substrate; covering less than all of the alignment marks with a transparent plate to provide covered alignment marks and uncovered alignment marks; measuring a first position of the uncovered alignment marks; measuring a first position of the covered alignment marks; calculating a first shift for the covered alignment marks between a first actual position and the first measured position of the second alignment marks; calculating a first value for the angle, using the first shift for each of the covered alignment marks.

According to another aspect of the present invention, there is provided a verification method including providing an alignment beam of radiation using an alignment system; providing a verification substrate that is transparent to the alignment beam of radiation; patterning the beam of radiation with a first pattern in its cross-section; projecting the first patterned beam of radiation onto a first side of the verification substrate to create a first verification mark; turning the verification substrate over; aligning the verification substrate; patterning the beam of radiation with a second pattern in its cross-section; projecting the second patterned beam of radiation onto a second side of the verification substrate to create a second verification mark; detecting the position of the first mark on the first side of the verification substrate using the alignment system; detecting the position of the second verification mark on the second side of the substrate using the alignment system, the verification substrate remaining stationary relative to a substrate table holding the verification substrate between the first detecting and the second detecting to measure a displacement between the first and the second verification mark in the plane of the substrate; calculating an angle of the alignment beam of the alignment system according to the method described above; and using the angle to correct the measured displacement in order to determine the front-to-back-side alignment error.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 2:
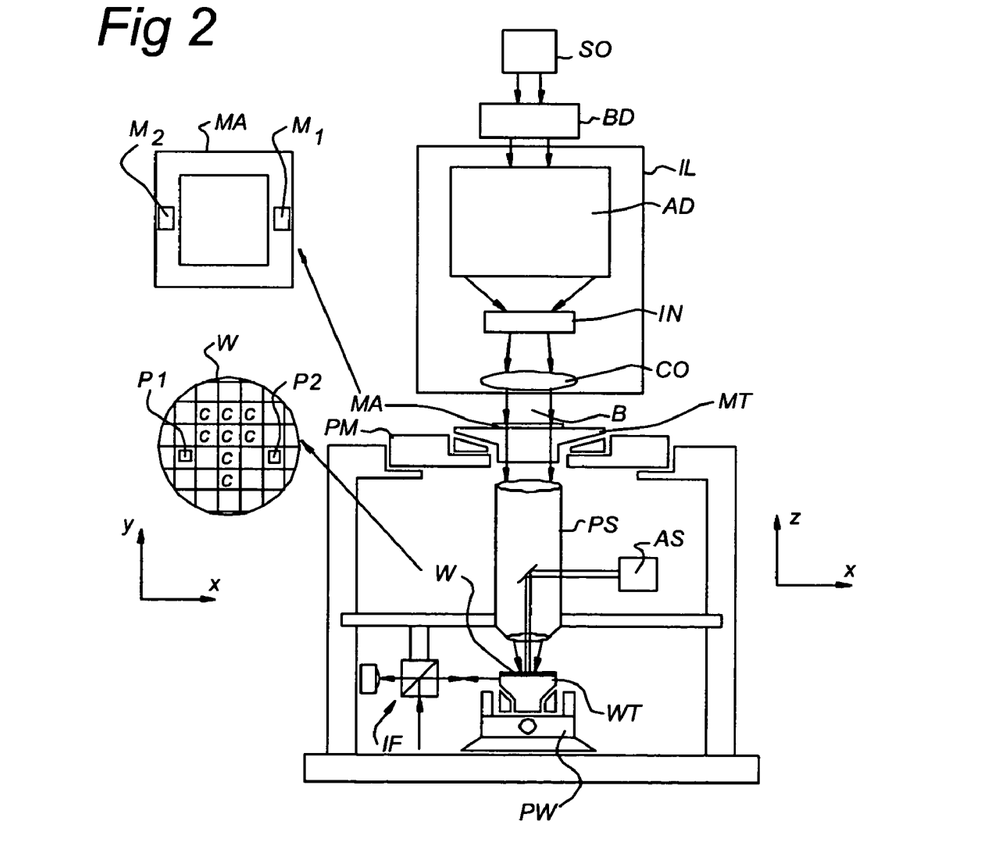
FIG. 2 depicts a lithographic apparatus according to an embodiment of the present invention.

FIG. 2 schematically depicts a lithographic apparatus according to an embodiment of the present invention. The apparatus includes an illumination system (illuminator) IL configured to condition a radiation beam B (e.g. UV radiation or radiation with a visible wavelength). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support MT supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between, for example, the projection system and the substrate during exposure.

Referring to FIG. 2, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD to adjust the angular intensity distribution of the radiation beam. Generally, at least the outer and/or inner radial extent, commonly referred to as σ-outer and σ-inner, respectively, of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (e.g. an interferometric device, linear encoder or capacitive sensor which is not explicitly depicted in FIG. 2) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed.

Mask MA and substrate W may be aligned using mask alignment marks M1, M2 and substrate alignment marks P1, P2. The substrate alignment marks P1, P2 can be detected by an alignment system AS. Although the substrate alignment marks as illustrated occupy dedicated target portions, they may be located in spaces between target portions. These are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 3A:
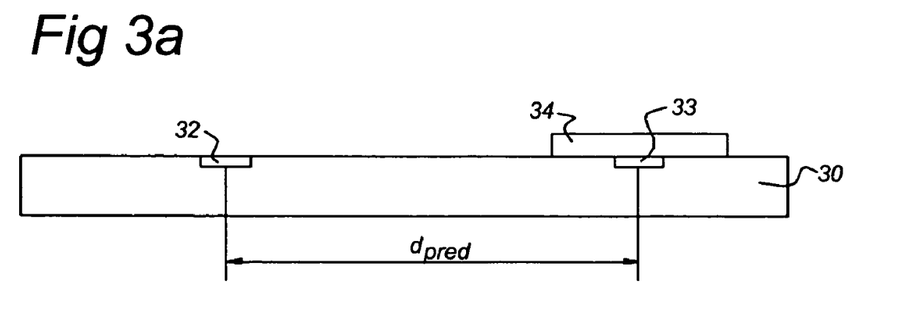
FIG. 3A depicts a cross-section of a measurement substrate according to the present invention.

According to the present invention, there is provided a method of calculating an angle of an alignment beam of an alignment system. The alignment system may be part of a lithographic projection apparatus, but it is appreciated that it may well be part of another projection or alignment apparatus, such as for example, a wafer bonder. In an embodiment, two marks are arranged on a measurement substrate (e.g. a measurement wafer) that can be positioned on the substrate table WT of the lithographic apparatus. FIG. 3A shows a cross-section of a measurement substrate 30 according to the present invention. The measurement substrate 30 includes a first alignment mark 32 at a first position and a second alignment mark 33 at a second position of the measurement substrate 30. The first and second marks may be grating marks, but other types of marks are possible. As shown in FIG. 3A, a transparent plate 34 is arranged on the measurement substrate 30 so as to cover the second alignment mark 33. In an embodiment, the transparent plate 34 is made of glass, but any other suitable transparent material may be used. The transparent plate 34 has preferably a refractive index of about 1.5 for light with a wavelength of 632.8 nm, but any other refractive index is possible. A thickness of the transparent plate 34 may be between 500 μm and 2 mm. The first alignment mark 32 and the second alignment mark 33 may be identical, but they may be of a different type as well.

Figure 3B:
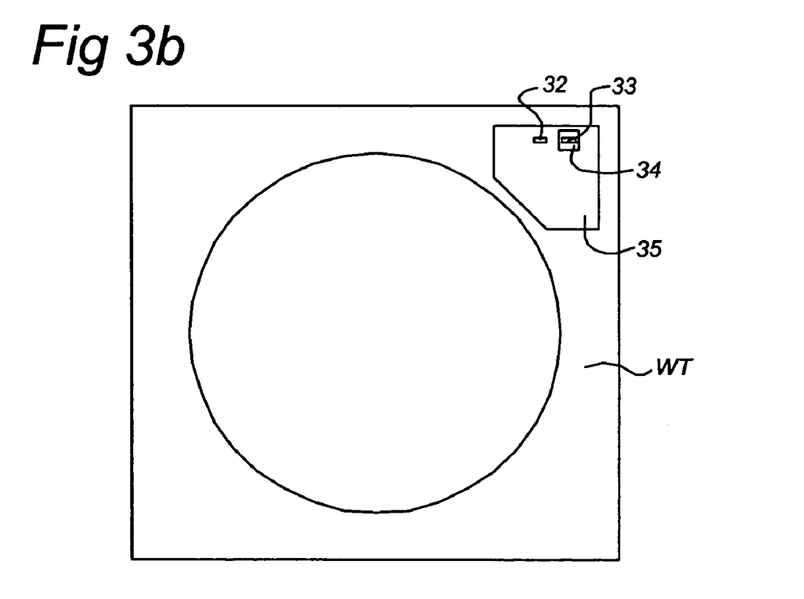
FIG. 3B depicts a top view of the substrate table with a measurement reference according to the present invention.

In another embodiment of the present invention, alignment marks 32, 33 and the transparent plate 34 are arranged on a measurement reference of the substrate table WT. FIG. 3B shows a top view of the substrate table WT with a measurement reference 35. The measurement reference 35 includes the first and second alignment marks 32, 33 respectively, and the transparent plate 34 on top of the second alignment mark 33. If the two alignment marks 32, 33 are arranged on the reference 35 of the substrate table WT, there are no measurement substrates needed.

Figure 3C:
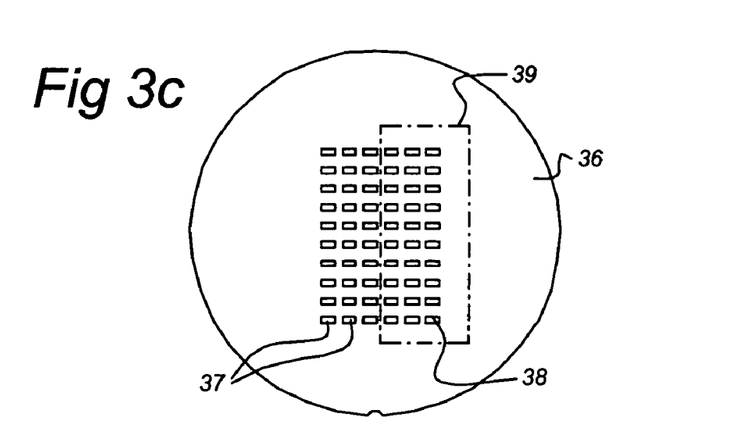
FIG. 3C depicts a top view of a measurement substrate according to an embodiment of the present invention.

FIG. 3C shows a top view of a measurement substrate 36 according to another embodiment of the present invention. The measurement substrate 36 includes a plurality of uncovered alignment marks 37 and a plurality of covered alignment marks 38. The covered alignment marks 38 are covered by a transparent plate 39. Using a plurality of uncovered alignment marks 37 is useful if the positions of the covered alignment marks 38 is measured only after the transparent plate 39 is arranged onto the measurement substrate 36, as will be explained below in more detail.

A method of calculating an angle of the alignment beam of an alignment system will be described using the substrate 30 having only two alignment marks 32, 33. The method starts by arranging the two alignment marks 32, 33 on the measurement substrate 30. Then, the second alignment mark 33 is covered by the transparent plate 34. The measurement substrate 30 will then be placed and aligned on the substrate table WT. In an embodiment, the position of both the first and the second alignment mark 32, 33 respectively, will be measured before the transparent plate 34 is placed on the second alignment mark 33. In this way a distance $d_{pred}$ between the first alignment mark 32 and the second alignment mark 33 can be determined, as shown in FIG. 3A. If this is done, the transparent plate 34 is arranged on top of the second alignment mark 33.

Figure 4:
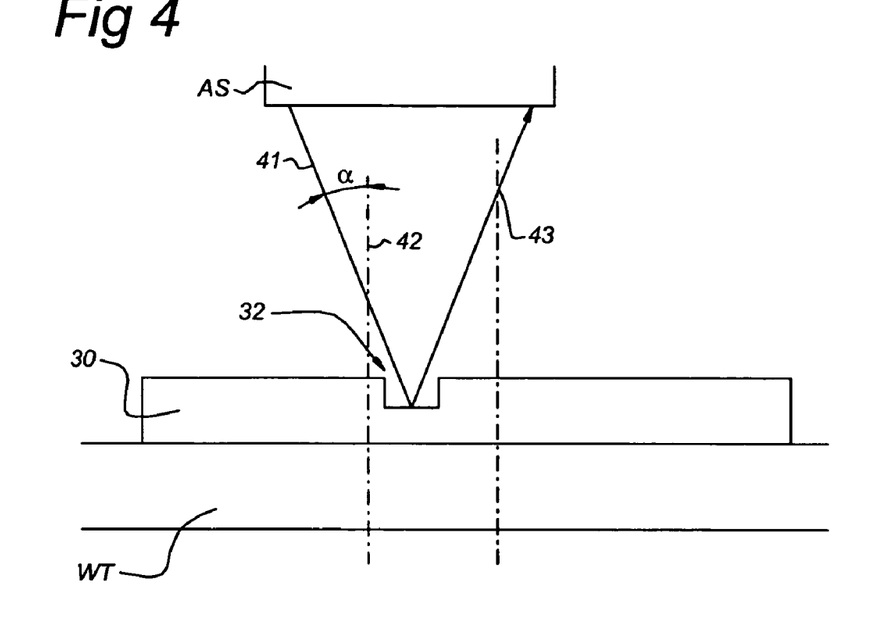
FIG. 4 depicts a cross-section of a first alignment mark on which an alignment beam is incident.
Figure 5:
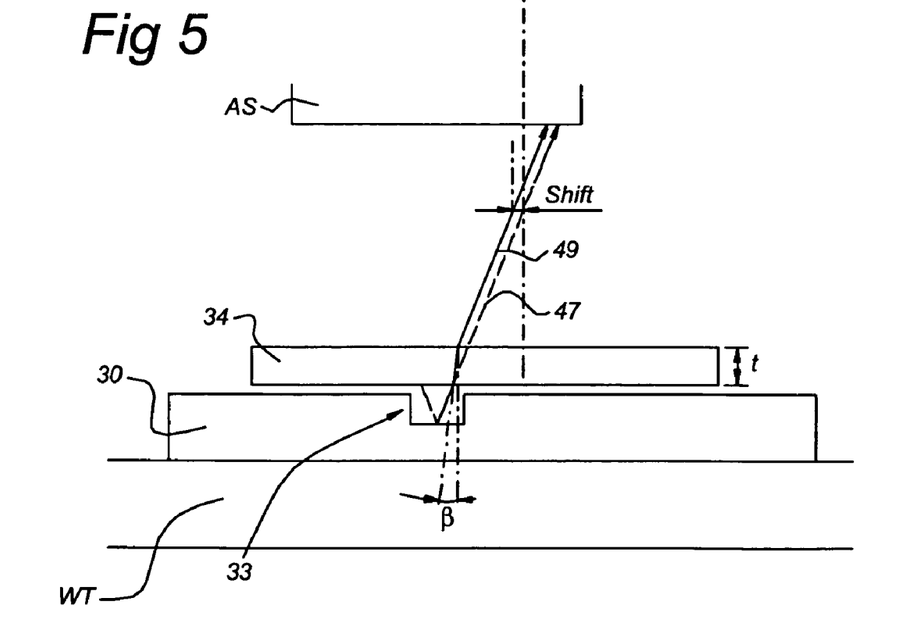
FIG. 5 depicts a cross-section of a second alignment mark which is covered by a transparent plate.

FIGS. 4 and 5 show two partial cross-sections of the measurement substrate 30 placed on the substrate table WT, together with a part of the alignment system AS. FIG. 4 shows the first alignment mark 32 on which an alignment beam 41 is incident. An angle between the alignment beam 41 and a perpendicular 42 on a surface of the measurement substrate 30 is referred to as α. The alignment beam 41 is reflected by the first alignment mark 32 resulting in a reflected alignment beam 43. The reflected alignment beam 43 will be detected by a detector of the alignment system AS in order to correctly detect the alignment mark 32. The first alignment mark 32 is arranged on a first position at the front side of the measurement substrate 30. Next, the substrate table WT is moved such that the alignment system AS detects the second alignment mark 33. FIG. 5 shows a cross-section of the second alignment mark 33 which is covered by the transparent plate 34. As in FIG. 4, the alignment beam 41 and the perpendicular 42 are shown as well as the angle α. Due to the presence of the transparent plate 34, the alignment beam 41 is refracted in a way shown in FIG. 5. The angle of the alignment beam 41 in the transparent plate 34 with reference to the perpendicular 42 is referred to as β. FIG. 5 also shows a dashed line 47 indicating a path of propagation of the alignment beam 41 in the case without any covering transparent plate 34. A thickness of the transparent plate 34 is indicated by t. A shifted reflected alignment beam 49 will leave the second alignment mark 33 as is shown in FIG. 5. The shifted reflected alignment beam 49 is shifted by an amount of shift with respect to the dashed line 47. The shift of the reflected alignment beam 49 will result in a position measurement by the alignment system AS that does not reflect the true position relative to perpendicular 42. However, the actual distance between the first and the second alignment marks 32, 33 is predetermined. See distance $d_{pred}$ in FIG. 3A. The shift due to the refraction in the transparent plate 34 is the difference between the measured position of alignment mark 33 and the actual position of alignment mark 33. Now, the angle α can be calculated using regular optical laws and using the thickness t of the transparent plate 34 by the following equation:

$$\alpha = \mathrm{atan}((\mathrm{shift}/t) + \tan(\beta)) \tag{1}$$

wherein t=thickness of the glass plate 34, α=the angle of the alignment beam 41 in the air with reference to the perpendicular 42, and β=the angle of the alignment beam 41 in the transparent plate 34 with reference to the perpendicular 42.

The variable β directly follows from the following equation:

$$\beta = \arcsin((n1/ng) * \sin(\alpha)) \tag{2}$$

wherein n1=refractive index of air and ng=refractive index of the glass of glass plate 34.

The angle α can now be calculated using equations (1) and (2). For the glass plate 34, BK7 glass or Corning 1737 glass may used. The refractive index of Corning 1737 glass is 1.5165 at 632.8 nm (=wavelength of alignment beam). The refractive index of BK7 glass is 1.51509 at the mentioned wavelength. Both glass types give good results.

In a second embodiment, the measurement substrate 36 shown in FIG. 3C is used and the positions of both the uncovered alignment marks 37 and the positions of the covered alignment marks 38 are measured only once, i.e. after the transparent plate 39 has been placed over the covered alignment marks 38. If the positions of the uncovered alignment marks 37 are measured, these positions can be used to determine the actual positions of the covered alignment marks 38, had they not been covered by the transparent plate 39, by way of, for example, extrapolation. In order to expose the alignment marks, a reticle is used having a regular grid of patterns, the covered alignment marks 38 are positioned on regular positions on the measurement substrate 36. However, because of the refraction of the alignment beam of the alignment system AS, the exact positions of the covered marks can not be measured. However, the positions of a plurality of uncovered alignment marks 37 can be accurately measured. These positions can be put into a data file and can be used to calculate the actual position of the covered alignment marks 38. This may be done by extrapolation of the positions of part or all of the uncovered alignment marks 37.

According to another embodiment, after the calculation of a first value for angle α, the measurement substrate 30 is rotated 180°. This can be done, for example, by rotating the substrate table WT 180°. Then, the process for calculating the angle α are repeated. This results in a second value for the angle α. Finally, a third value for the angle α is calculated by taking a mean value of the first and the second values. By rotating the measurement substrate 30 and taking the mean value of the two calculated angles, a measurement error due to tilting of the transparent plate 34 with respect to the substrate surface during positioning of the transparent plate 34 is eliminated, resulting in a more accurate value for angle α. Preferably, a series of shifts of all the covered marks is used to determine the angle α, which will result in a reduction of measurement errors.

Instead of taking a mean value of the first and the second value for α, it is possible to use a difference between the first shift and the second shift. In the case of only one uncovered and one covered alignment mark, the angle α can be determined by the following equation:

$$2*t*\tan(\beta)=shift\_1-shift\_2 \quad (2a)$$

wherein t=thickness of the glass plate 34, shift_1 is the measured shift of the covered alignment mark 33 before rotation, and shift_2 is the measured shift of the covered mark 33 after rotation.

Now, the angle α can be calculated using formulas (2) and (2a).

Figure 6:
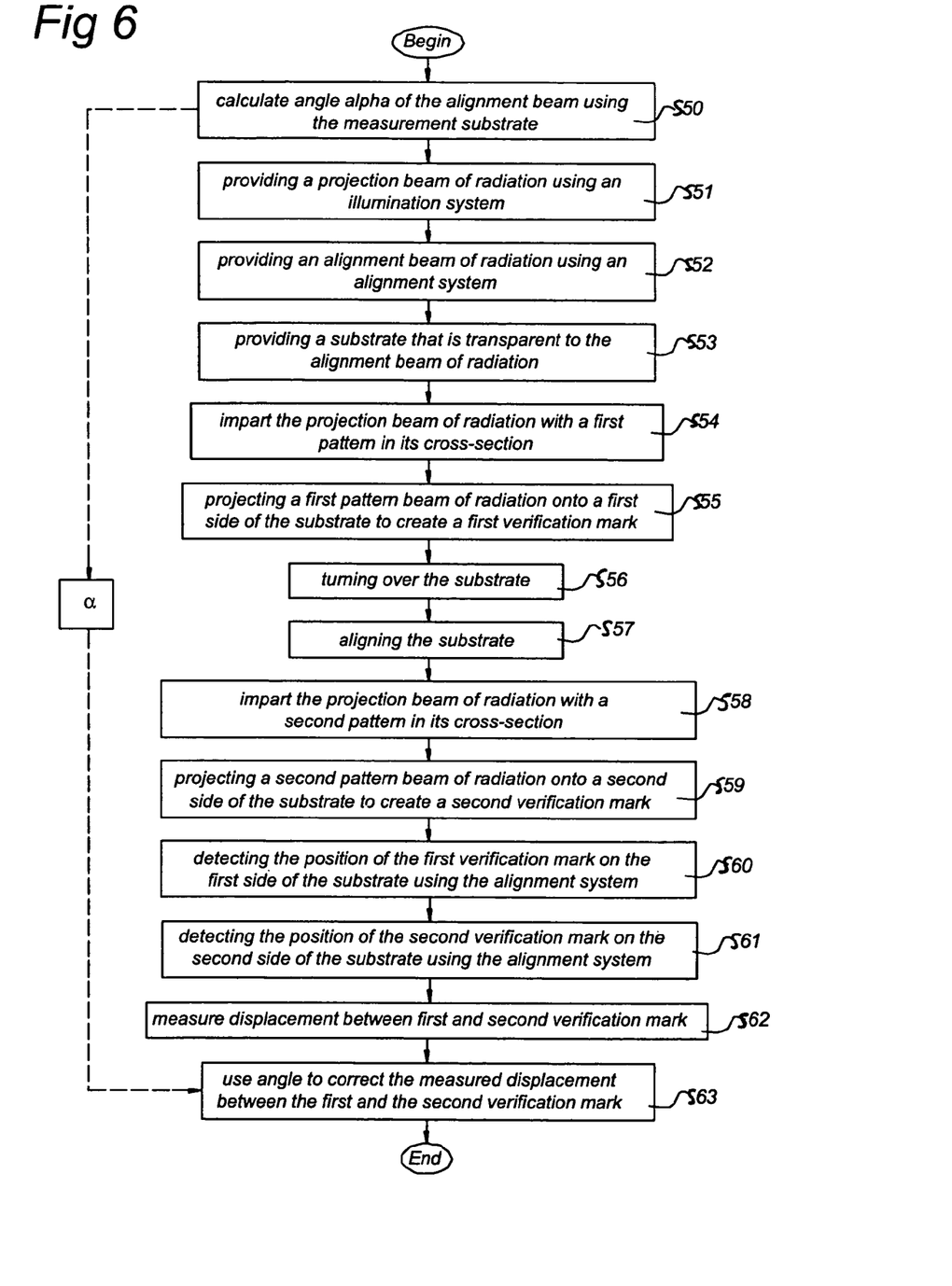
FIG. 6 is a flow chart describing a method according to an embodiment of the present invention.

According to a further embodiment, there is provided an alignment verification method for verifying a defined front-to-back-side alignment error in a lithographic apparatus. This method may, for example, be used by a user of a lithographic apparatus to verify whether a specification of FTBA overlay given by the manufacturer of the apparatus is correct. Referring to FIG. 6, a flow chart of the method is shown. The method begins and proceeds to S50 wherein the angle α of the alignment beam of the alignment system AS is calculated. The angle α is determined according to one of the methods described above using, for example, the measurement substrate 30 or measurement substrate 36. Then, in S51 a beam of radiation is provided. Next, in S52 an alignment beam of radiation is provided. Then, in S53 a verification substrate is provided that is transparent to radiation of the alignment beam. The method proceeds to S54 wherein a the beam of radiation is imparted with a first pattern in its cross-section. Then, in S55 the first patterned beam of radiation is projected onto a first side of the verification substrate to create a first verification mark. The verification mark may be arranged as described in U.S. application Ser. No. 10/900,393. Next, in S56 the verification substrate is turned over. Then, in S57 the verification substrate is aligned using any suitable alignment strategy to align a substrate without marks, e.g. by aligning on a flat edge (or wedge) of the substrate. It is also possible to back-side align the verification substrate using the exposed verifications marks. Next, in S58 the beam of radiation is imparted with a second pattern in its cross-section. Then, in S59 the second patterned beam of radiation is projected onto a second side of the substrate to create a second verification mark. In S60 the position of the first verification mark on the first side of the substrate is detected using the alignment system and in S61 the position of the second verification mark on the second side of the substrate is detected using the alignment system. Between the first and the second detection actions (i.e. between S60 and S61), the substrate remains stationary relative to a substrate table WT. In S62 a displacement between the first and the second verification marks in the plane of the substrate is then calculated.

The actions described above are described in U.S. Patent Application Publication 2006/0023214 A1. The displacement between the first and the second verification mark can be used to verify whether a lithographic apparatus has a FTBA overlay error as is defined by the manufacturer. Due to the fact that the second verification mark is detected through the transparent substrate, the alignment beam must be perpendicular to the plane of the substrate. As mentioned above, this is not always the case in real life. Therefore, according to the invention the information on the angle α is used, in S63, to correct the measured FTBA overlay error between the first and the second verification mark. In this way, a more accurate FTBA overlay error is available for verification purposes.

Figure 7:
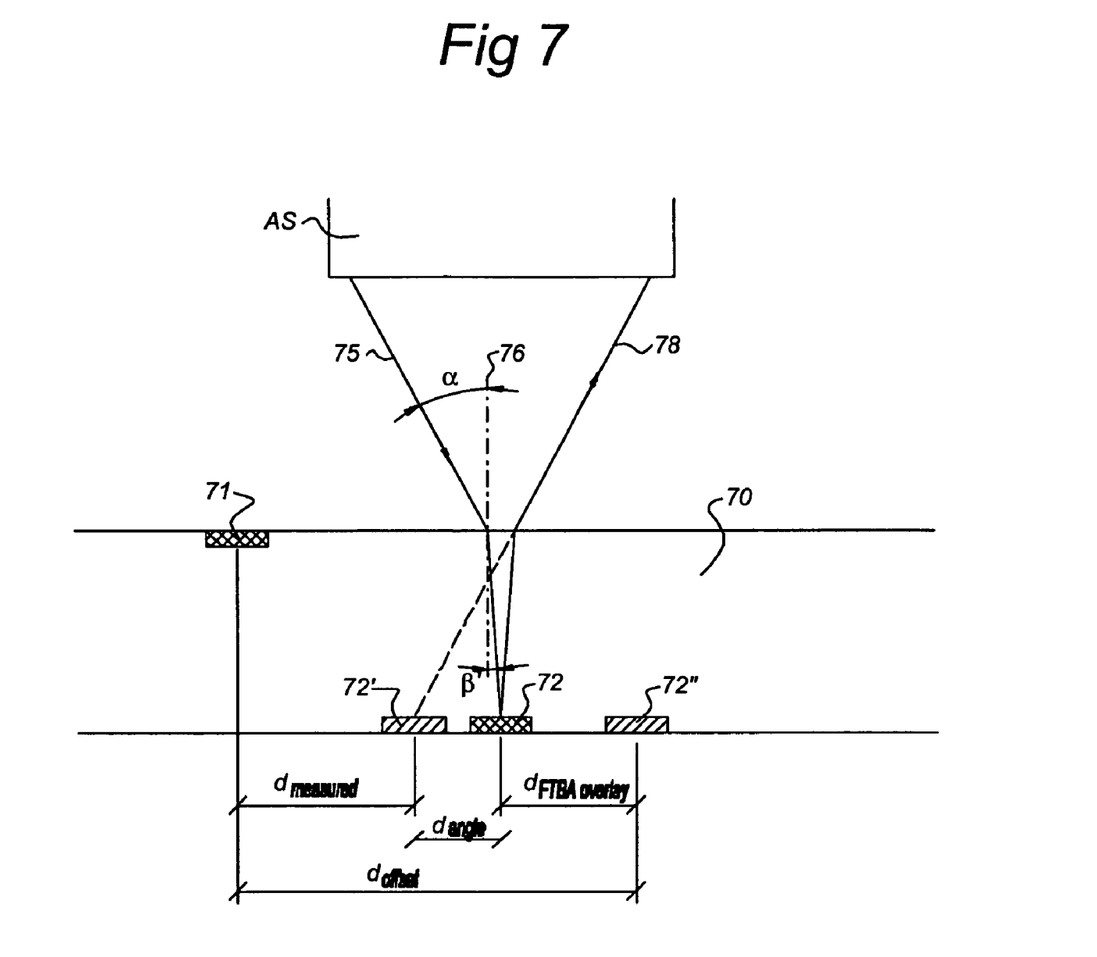
FIG. 7 depicts a cross-section of a verification substrate with two verification marks.

S63 is now explained in more detail with reference to FIG. 7. FIG. 7 shows a partial cross-section of a transparent verification substrate 70. The verification substrate 70 includes at least a first verification mark 71 on a front side of the verification substrate 70 and a second verification mark 72 on a back side of the verification substrate 70. The alignment system AS sends an alignment beam 75 to the verification substrate 70 in order to detect the second verification mark 72. The alignment beam 75 has an angle α with respect to a perpendicular 76 on the verification substrate 70. The alignment beam 75 is refracted by the verification substrate 70 in such a way that it is directed with a angle β' with respect to the perpendicular 76. It is incident on, and reflected by, the second verification mark 72, and leaves the verification substrate 70 as a reflected beam 78. The reflected beam 78 is detected by the alignment system AS. The second verification marks is exposed with an offset $d_{offset}$, relative to the first verification mark 71 In the ideal situation the second verification mark would have been processed as verification mark 72". Due to an FTBA overlay error, the second verification mark is however exposed at position 72. But due to the angle of the alignment beam 75, the alignment system AS measures a second verification mark, in the position 72', as shown by $d_{measured}$.

The actual overlay $d_{FTBA}$ can be calculated by the following equation:

$$d_{FTBA}=d_{measured}-d_{offset}-d_{angle} \quad (3)$$

$$\text{wherein } d_{angle}=t\cdot(\tan(\alpha)-\tan(\beta')) \quad (4)$$

β can be determined using equation (2) and the refractive index of the transparent verification substrate 70.

Using the present invention, the verification of the FTBA overlay is more reliable than was possible using previous techniques. Furthermore, there is no need for refocusing the substrate when detecting the second verification mark, as described in U.S. Patent Application Publication 2006/0023214 A1.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. The calculation of the angle α may be used to minimize errors in detecting buried marks. Furthermore, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent that modifications may be made to the present invention as described without departing from the scope of the claims set out below. For example, the angle α is defined above relative to a perpendicular to a surface. However, angle α can be defined relative to any other suitable line.

What is claimed is:

1. A method of calculating an angle of an alignment beam of an alignment system with respect to a predetermined line, the method comprising:
   arranging a plurality of alignment marks on a measurement substrate;
   covering less than all of the alignment marks with a transparent plate to provide a covered alignment mark and an uncovered alignment mark;
   measuring a first position of the uncovered alignment mark;
   measuring a first position of the covered alignment mark;
   calculating a first shift for the covered alignment mark between a first actual position and the first measured position of the covered alignment mark; and
   calculating a first value for the angle, using the first shift for the covered alignment mark.

2. A method according to claim 1, wherein the actual position of the covered alignment mark is measured before the covered alignment mark is covered by the transparent plate.

3. A method according to claim 1, wherein the actual position of each of a plurality of covered alignment marks is calculated by extrapolation of the measured positions of at least some of a plurality of uncovered alignment marks.

4. A method according to claim 1, further comprising:
   arranging the measurement substrate into a reference of a substrate table of a lithographic apparatus.

5. A method according to claim 1, further comprising:
   rotating the measurement substrate 180°;
   measuring a second position of the uncovered alignment mark;
   measuring a second position of the covered alignment mark; and
   calculating a second shift for the covered alignment mark between a second actual position and the second measured position of the covered alignment mark.

6. A method according to claim 5, further comprising:
   calculating a second value for the angle using the second shift; and
   calculating a third value for the angle, the third angle being a mean value of the first and the second values.

7. A method according to claim 5, wherein the first value for the angle is calculated using a difference between the first shift and the second shift for the covered alignment mark.

8. A method according to claim 1, comprising a plurality of covered alignment marks and a plurality of uncovered alignment marks.

9. An alignment verification method for verifying a defined front-to-back-side alignment error in a lithographic apparatus comprising an alignment system, the method comprising:
   providing an alignment beam of radiation using an alignment system;
   providing a verification substrate that is transparent to the alignment beam of radiation;
   patterning the beam of radiation with a first pattern in its cross-section;
   projecting the first patterned beam of radiation onto a first side of the verification substrate to create a first verification mark;
   turning the verification substrate over;
   aligning the verification substrate;
   patterning the beam of radiation with a second pattern in its cross-section;
   projecting the second patterned beam of radiation onto a second side of the verification substrate to create a second verification mark;
   detecting the position of the first mark on the first side of the verification substrate using the alignment system;
   detecting the position of the second verification mark on the second side of the substrate using the alignment system, the verification substrate remaining stationary relative to a substrate table holding the verification substrate between the first detecting and the second detecting to measure a displacement between the first and the second verification mark in the plane of the substrate; and
   calculating an angle of the alignment beam of the alignment system according to a method comprising:
      arranging a plurality of alignment marks on a measurement substrate;
      covering less than all of the alignment marks with a transparent plate to provide a covered alignment mark and an uncovered alignment mark;
      measuring a first position of the uncovered alignment mark;
      measuring a first position of the covered alignment mark;
      calculating a first shift for the covered alignment mark between a first actual position and the first measured position of the covered alignment mark;
      calculating a first value for the angle, using the first shift for the covered alignment mark; and
      using the angle to correct the measured displacement in order to determine the front-to-back-side alignment error.

* * * * *